United States Patent
Wu et al.

(10) Patent No.: US 11,951,569 B2
(45) Date of Patent: Apr. 9, 2024

(54) DAMAGE PREVENTION DURING WAFER EDGE TRIMMING

(71) Applicant: Taiwan Semiconductor Manufacturing Co., Ltd., Hsinchu (TW)

(72) Inventors: Kuo-Ming Wu, Zhubei (TW); Yung-Lung Lin, Taichung (TW); Hau-Yi Hsiao, Chiayi (TW); Sheng-Chau Chen, Tainan (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 318 days.

(21) Appl. No.: 17/317,977

(22) Filed: May 12, 2021

(65) Prior Publication Data
US 2022/0362887 A1 Nov. 17, 2022

(51) Int. Cl.
*H01L 21/02* (2006.01)
*B23K 26/035* (2014.01)
*B23K 26/062* (2014.01)
*B23K 26/361* (2014.01)
*H01L 21/66* (2006.01)

(52) U.S. Cl.
CPC .......... *B23K 26/361* (2015.10); *B23K 26/035* (2015.10); *B23K 26/062* (2015.10); *H01L 21/02021* (2013.01); *H01L 22/10* (2013.01)

(58) Field of Classification Search
CPC ................................................ H01L 21/02021
See application file for complete search history.

(56) References Cited

U.S. PATENT DOCUMENTS

| | | | |
|---|---|---|---|
| 2017/0047241 A1* | 2/2017 | Priewasser | H01L 21/268 |
| 2019/0148130 A1* | 5/2019 | Chiang | H01L 21/30604 |
| | | | 257/797 |
| 2020/0027773 A1* | 1/2020 | Lin | B23D 61/021 |

(Continued)

OTHER PUBLICATIONS

Foucher et al. "Raman Spectroscopy and Applications Chapter 8: Petrographical and Mineralogical Applications of Raman Mapping." Published on Feb. 15, 2017.

(Continued)

*Primary Examiner* — Jae Lee
(74) *Attorney, Agent, or Firm* — Eschweiler & Potashnik, LLC

(57) ABSTRACT

In some embodiments, the present disclosure relates to a wafer edge trimming apparatus that includes a processing chamber defined by chamber housing. Within the processing chamber is a wafer chuck configured to hold onto a wafer structure. Further, a blade is arranged near an edge of the wafer chuck and configured to remove an edge potion of the wafer structure and to define a new sidewall of the wafer structure. A laser sensor apparatus is configured to direct a laser beam directed toward a top surface of the wafer chuck. The laser sensor apparatus is configured to measure a parameter of an analysis area of the wafer structure. Control circuitry is to the laser sensor apparatus and the blade. The control circuitry is configured to start a damage prevention process when the parameter deviates from a predetermined threshold value by at least a predetermined shift value.

20 Claims, 14 Drawing Sheets

(56) References Cited

U.S. PATENT DOCUMENTS

2021/0053148 A1* 2/2021 Rieske .............. H01L 21/02002
2022/0157627 A1* 5/2022 Cai ................... H01L 21/67288

OTHER PUBLICATIONS

Panchal et al. "Confocal Laser Scanning Microscopy for Rapid Optical Characterization of Graphene." Communications Physics vol. 1, Article No. 83 (2018), published on Nov. 20, 2018.
Horiba. "What is Raman Spectroscopy?" The date of publication is unknown. Retrieved online on Mar. 1, 2021 from https://www.horiba.com/en_en/raman-imaging-and-spectroscopy/.
Wikipedia.org. "Wavenumber" Published on Feb. 21, 2021.

* cited by examiner

DAMAGE PREVENTION DURING WAFER EDGE TRIMMING

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconducting material. During fabrication, the edge of the wafer may become damaged or otherwise unsuitable for use with electronic circuits. Hence, the edge of the wafer may be trimmed during fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
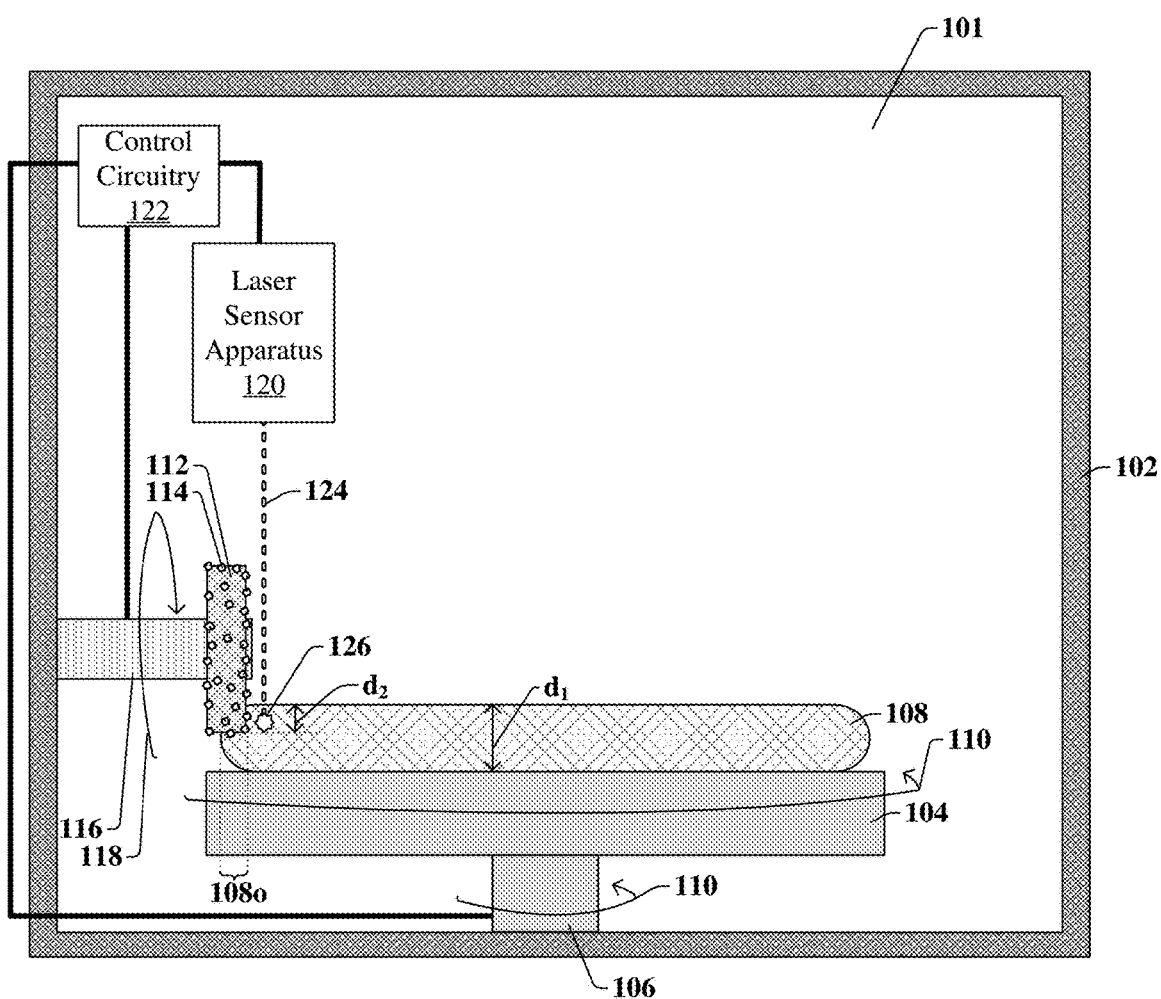
FIG. 1 illustrates a cross-sectional view of some embodiments of a wafer edge trimming apparatus comprising a laser sensor apparatus arranged over a wafer chuck and beside a blade that is configured to measure parameters of a wafer structure on the wafer chuck to mitigate damage to the wafer structure during wafer edge trimming.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor device fabrication, integrated circuits may be formed on a wafer structure made of a semiconductor material. In some fabrication methods, edges of the wafer structure become damaged and/or are unreliable during fabrication, and thus are removed. For example, in some embodiments, the wafer structure may be warped at its edges. In other embodiments, multiple wafers and/or layers are stacked upon and bonded to one another, and at the edges of the stack, the bonding may be weak. Even further, in some embodiments, robots may contact the wafer structure at the edges for transportation, causing damage. In some such embodiments, an entire edge portion of the multiple wafers is removed, whereas in some other embodiments, only the edge portion of one of the wafers is removed from the stack of multiple wafers bonded to one another.

Thus, semiconductor device fabrication may include a wafer edge trimming process that uses a blade to remove damaged edge portions of the wafer structure. The wafer edge trimming process may occur in a processing chamber comprising a wafer chuck that holds the wafer structure during the wafer edge trimming process. In some embodiments, the blade is coupled to a spindle that continuously rotates the blade around the axis of the spindle. In some embodiments, the wafer chuck rotates, whereas the blade, although rotating around the spindle, remains stationary with respect to its location in the processing chamber.

However, in some embodiments, as the blade trims an edge portion of the wafer structure from a center portion of the wafer structure, stresses (e.g., tensile stress, compressive stress, etc.) begin to build in the remaining center portion of the wafer structure at an area near the blade. In some instances, the stresses can cause peeling between layers of the wafer structure occurs followed by cracking. As a result, portions of the wafer structure break off, such that the wafer structure is more damaged after the wafer edge trimming process than before the wafer edge trimming process.

Various embodiments of the present disclosure relate to a processing chamber used for a wafer edge trimming process that comprises a wafer chuck, a blade coupled to a spindle, and a laser sensing apparatus arranged beside the blade and configured to detect stresses in the wafer structure to mitigate damage (e.g., cracking, peeling) to the wafer structure. In some embodiments, the laser sensing apparatus comprises a confocal laser to perform a confocal laser scanning microscopy (CLSM) process that optically detects the topography and internal crystal structure of the wafer structure. In some embodiments, the confocal laser is directed towards the wafer chuck at an area just beside the blade such that the CLSM process can analyze an analysis area of the wafer structure just beside where the wafer structure is being trimmed. The CLSM process is conducted in real-time with the wafer edge trimming process.

In some embodiments, the CLSM process measures the topography of the wafer structure and measures the crystal structure based on Raman scattering. When the Raman peak as measured by the CLSM process shifts from a predetermined Raman threshold value by a predetermined shift value, control circuitry triggers a damage prevention process to begin. The predetermined shift value indicates that the stress build-up in the wafer structure will soon crack and/or peel if the damage prevention process is not utilized. In some embodiments, the damage prevention process reduces a speed of the wafer chuck and/or blade rotation. In some other embodiments, the damage prevention process changes a temperature of the processing chamber and/or cooling liquids used during the wafer edge trimming process. In yet other embodiments, the damage prevention process changes some other condition of the processing chamber to reduce the chances of cracking, peeling, and/or other damage from occurring in the wafer structure to improve the reliability of the wafer edge trimming process and resulting integrated circuits.

FIG. 1 illustrates a cross-sectional view 100 of some embodiments of a wafer edge trimming apparatus comprising a laser sensor apparatus arranged over the wafer chuck.

The wafer edge trimming apparatus of FIG. 1 comprises a processing chamber 101 defined by chamber housing 102. In some embodiments, a wafer chuck 104 is arranged near a bottom of the processing chamber 101 and is configured to hold a wafer structure 108 during a wafer edge trimming process. In some embodiments, the wafer structure 108 has a thickness equal to a first distance $d_1$. In some embodiments, the wafer chuck 104 is arranged over, coupled to, and controlled by a first spindle 106. In some embodiments, the first spindle 106 is coupled to control circuitry 122 and is configured to rotate 110 according to a certain rotational speed controlled by the control circuitry 122. Thus, in some embodiments, the wafer chuck 104 is configured to rotate 110, thereby rotating the wafer structure 108 arranged thereon. In some embodiments, the wafer chuck 104 is configured to securely hold onto the wafer structure 108 during the rotation 110 of the wafer chuck 104 and other steps of the wafer edge trimming process. In some embodiments, the wafer chuck 104 holds onto the wafer structure 108 through electrostatic contacts, vacuum suction, or some other suitable securing technique.

In some embodiments, a blade 112 is arranged over the wafer chuck 104 and also over an edge portion 108o of the wafer structure 108. In some embodiments, the blade 112 comprises diamonds 114 embedded in the blade 112 to aid in the precision and accuracy of the cut provided by the blade 112. In some other embodiments, the blade 112 may comprise other materials than diamonds 114. In some embodiments, the blade 112 is coupled to a second spindle 116 that is configured to rotate 118 the blade 112. In some embodiments, the second spindle 116 is coupled to the control circuitry 122, wherein the control circuitry 122 can control the rotational speed of the second spindle 116 and the blade 112. In some embodiments, the second spindle 116 is fixed to an inner sidewall of the chamber housing 102. In some other embodiments, the second spindle 116 can be moved up and down for loading and unloading of the wafer structure 108 within the processing chamber 101. Nevertheless, in some embodiments, the blade 112 is configured to remove the edge portion 108o of the wafer structure 108 during a wafer edge trimming process. In some embodiments, the blade 112 is configured to remove the edge portion 108o at a certain trim depth equal to a second distance $d_2$. In some embodiments, the second distance $d_2$ is less than the first distance $d_1$, whereas in some other embodiments, the second distance $d_2$ is greater than or equal to the first distance $d_1$.

In some embodiments, the processing chamber 101 further comprises a laser sensor apparatus 120. In some embodiments, the laser sensor apparatus 120 is arranged directly over the wafer chuck 104 and is configured to direct a laser beam 124 towards the wafer chuck 104 to measure properties of the wafer structure 108. In some embodiments, the laser beam 124 is configured to measure properties of the wafer structure 108 at an analysis area 126 of the wafer structure 108. In some embodiments, the analysis area 126 is an internal portion of the wafer structure 108 arranged between upper and lower surfaces of the wafer structure 108 such that the laser sensor apparatus 120 measures properties of the crystal structure of the wafer structure 108. In some embodiments, the analysis area 126 may be arranged on an upper surface of the wafer structure 108 to measure features of the topography of the wafer structure 108. In some embodiments, the analysis area 126 is arranged near an edge of the wafer structure 108 and is arranged between the blade 112 and a center of the wafer structure 108. In some embodiments, the analysis area 126 is arranged much closer to the blade 112 than the center of the wafer structure 108.

For example, in some embodiments, the laser sensor apparatus 120 comprises a confocal laser configured to direct the laser beam 124 to the analysis area 126 within the wafer structure 108. In some embodiments, the laser sensor apparatus 120 comprises circuitry configured to process the measurements of the analysis area 126. In some other embodiments, the control circuitry 122 coupled to the laser sensor apparatus 120 processes the measurements of the analysis area 126. In some embodiments, the laser sensor apparatus 120 conducts measurements using a confocal laser scanning microscopy (CLSM) process. In some embodiments, the CLSM process measures Raman intensity curves that correspond to the crystal structure of the analysis area 126 of the wafer structure 108. In some embodiments, while the wafer edge trimming process is occurring to remove the edge portion 108o of the wafer structure 108, the laser sensor apparatus 120 continuously gathers Raman intensity data of the analysis area 126 of the wafer structure 108.

In some embodiments, the Raman intensity data corresponds to the crystal structure of the analysis area 126 and indicates the presence of stresses (e.g., tensile stress, compressive stress, etc.) in the analysis area 126 of the wafer structure 108 as the blade 112 is removing the edge portion 108o of the wafer structure 108. Stresses build up in the wafer structure 108 from the force of the blade 112 on the wafer structure 108. The analysis area 126 of the wafer structure 108 measured by the laser sensor apparatus 120 continuously changes because the laser sensor apparatus 120 is stationary while the wafer structure 108 rotates 110. As will be explained further in FIG. 7, Raman peaks of the Raman intensity data shift as stresses are built up in the analysis area 126. In some embodiments, when the stresses build up too much based on the Raman intensity data measured by the laser sensor apparatus 120, the control circuitry 122 implements a damage prevention process during the wafer edge trimming process to prevent the stresses from causing damage (e.g., peeling, cracking, etc.) to the wafer structure 108. In some embodiments, as will be described in FIG. 7, the analysis area 126 is prone to damage when a parameter measurement (e.g., Raman intensity data) deviates from a predetermined threshold value by at least a predetermined shift value. In some other embodiments, the parameter measurement may be an average surface roughness or some other structural or chemical feature of the wafer structure 108 that corresponds to damage or defects.

In some embodiments, the control circuitry 122 is configured to implement the damage prevention process by reducing a speed of the wafer chuck 104 and/or blade 112 rotation. In some other embodiments, the control circuitry 122 is configured to implement the damage prevention process by changing some other condition of the processing chamber 101 such as the temperature of the processing chamber 101, the pressure of any cooling liquids (not shown) used near the blade 112, or some other suitable condition that prevents damage to the wafer structure 108. After the parameter measurement of the analysis area 126 deviates from the predetermined threshold value by some value less than the predetermined shift value, then the control circuitry 122 may return the processing conditions back to the original processing conditions used prior to the damage prevention process. Thus, the laser sensor apparatus 120 and the control circuitry 122 can change processing parameters of the wafer edge trimming process in real-time according to data measured by the laser sensor apparatus 120 to improve reliability of the wafer edge trimming process and reduce damage in the wafer structure 108.

Figure 2:
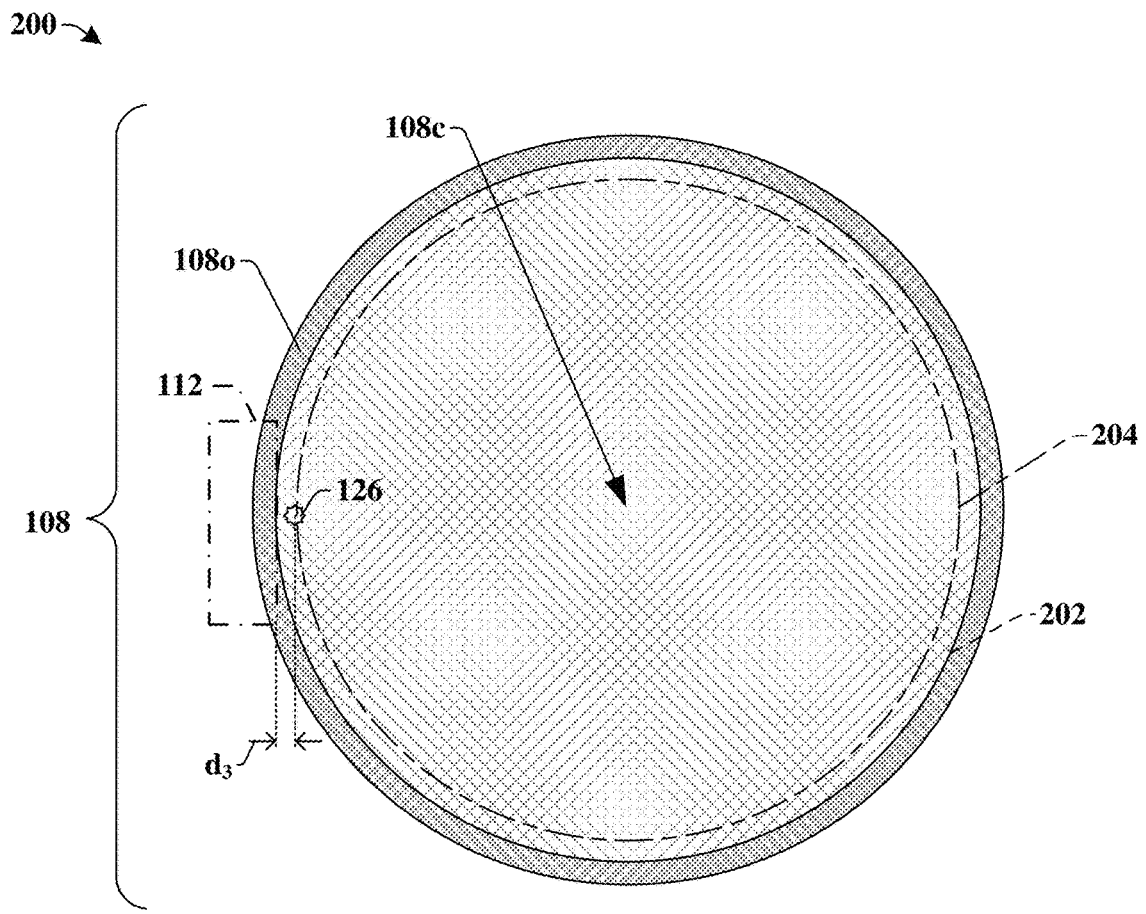
FIG. 2 illustrates a top-view of some embodiments of a wafer structure showing how a laser apparatus measures parameters of an analysis area of the wafer structure arranged between a blade and a center of the wafer structure.

FIG. 2 illustrates a top-view 200 of some embodiments of various portions of a wafer structure used throughout a wafer edge trimming process.

The top-view 200 illustrates the edge portion 108o to be removed from the wafer structure 108. In some embodiments, the edge portion 108o is a continuous ring-like portion of the wafer structure 108. Further, the blade 112, which is illustrated with a hash-dot line in FIG. 2, is configured to remove the edge portion 108o along a trim-path 202, which is illustrated with a hashed line. The trim-path 202 separates the edge portion 108o, which may comprise damage, from an inner edge portion, which may not comprise damage, that is defined by a new sidewall (see, 302 of FIG. 3) by the wafer edge trimming process.

In some embodiments, the blade 112 rotates around the second spindle (116 of FIG. 1), but remains stationary from the top-view 200 as the wafer structure 108 rotates towards the blade 112 during the wafer edge trimming process. In some embodiments, the laser beam (124 of FIG. 1) remains stationary from the top-view 200 as the wafer structure 108 rotates. Thus, in some embodiments, laser sensor apparatus (120 of FIG. 1) measures the analysis area 126 continuously along a measurement path 204, which is illustrated by a long-short hashed line, during the wafer edge trimming process.

In some embodiments, the analysis area 126 of the wafer structure 108 is arranged right next to the blade 112. In some embodiments, the analysis area 126 is located as close to the blade 112 as possible to collect the most accurate and precise data indicative of potential damage from the blade 112 in the wafer structure 108. Thus, in some embodiments, the analysis area 126 is located directly over the wafer structure 108 and directly between the blade 112 and a center 108c of the wafer structure 108. In some such embodiments, the analysis area 126 is located much closer to the blade 112 than the center 108c of the wafer structure 108. In some embodiments, the analysis area 126 is located at a third distance $d_3$ from the blade 112. In some embodiments, the third distance $d_3$ is in a range of between, for example, approximately 10 nanometers to approximately 1000 micrometers.

Figure 3:
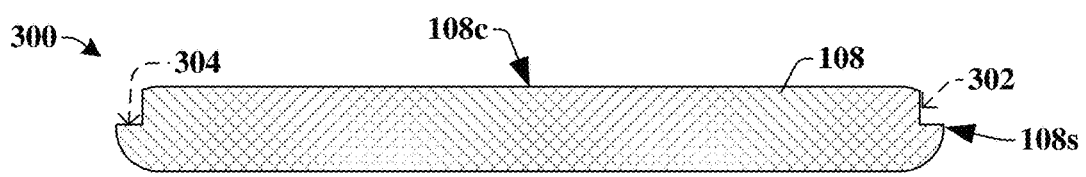
FIGS. 3-5 illustrate cross-sectional views of various embodiments of a wafer structure after wafer edge trimming.
Figure 4:
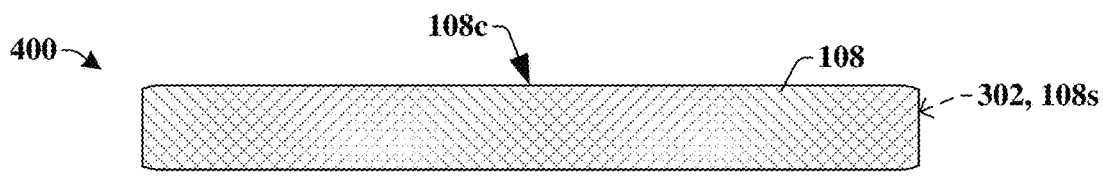
Figure 5:
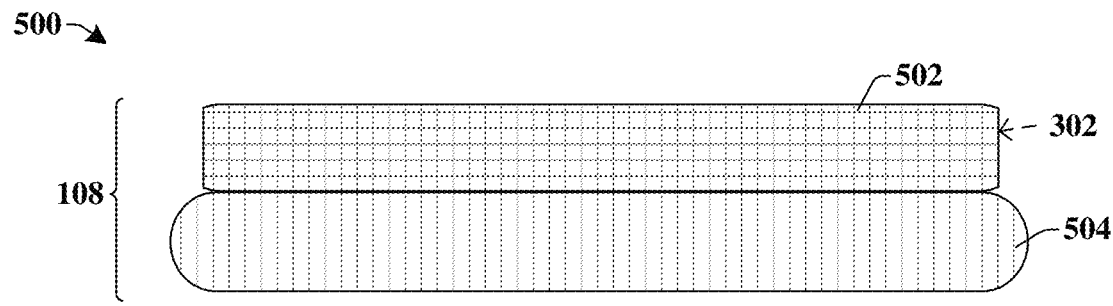

FIGS. 3, 4, and 5 illustrate cross-sectional views 300, 400, and 500 of various wafer structures after a wafer edge trimming process.

As shown in cross-sectional view 300 of FIG. 3, in some embodiments, the wafer structure 108 is a single wafer comprising a semiconductor material (e.g., silicon, germanium, etc.) or some other suitable, supportive material (e.g., glass). In some embodiments, various layers and circuits (not shown) are arranged on the wafer structure 108. In some embodiments, the wafer edge trimming process defines a new sidewall 302 of the wafer structure 108. In some embodiments, the new sidewall 302 is arranged between the center 108c of the wafer structure 108 and an outermost sidewall 108s of the wafer structure 108. The new sidewall 302 is defined by the trim-path (202 of FIG. 2) of the blade (112 of FIG. 2). Further, in some embodiments, the trim depth ($d_2$ of FIG. 1) is less than the thickness ($d_1$ of FIG. 1) of the wafer structure 108 such that the wafer edge trimming process also defines a new horizontal surface 304 of the wafer structure 108 arranged between a topmost surface and a bottommost surface of the wafer structure 108. In some embodiments, the laser sensor apparatus (120 of FIG. 1) and the control circuitry (122 of FIG. 1) prevent damage (e.g., peeling, cracking, etc.) to the wafer structure 108 at a region of the wafer structure 108 near the new sidewall 302 and the new horizontal surface 304 of the wafer structure 108.

As shown in cross-sectional view 400 of FIG. 4, in some embodiments, the trim depth ($d_2$ of FIG. 1) is greater than or equal to the thickness ($d_1$ of FIG. 1) of the wafer structure 108 such that the new sidewall 302 defined by the wafer edge trimming process is also the outermost sidewall 108s of the wafer structure 108.

As shown in cross-sectional view 500 of FIG. 5, in some other embodiments, the wafer structure 108 may comprise multiple wafers or substrates bonded to one another, such as, for example, a silicon-on-insulator substrate, a stack of wafers bonded to one another for packaging, or the like. For example, in some embodiments, the wafer structure 108 comprises a first wafer 502 arranged over and bonded to a second wafer 504. In some embodiments, the wafer edge trimming process only removes an edge portion (108o of FIG. 2) of the first wafer 502 to define a new sidewall 302 of the first wafer 502. In some other embodiments, the wafer edge trimming process may remove edge portions (108o of FIG. 2) of the first and second wafers 502, 504 to define the new sidewall 302 of the overall wafer structure 108.

Figure 6:
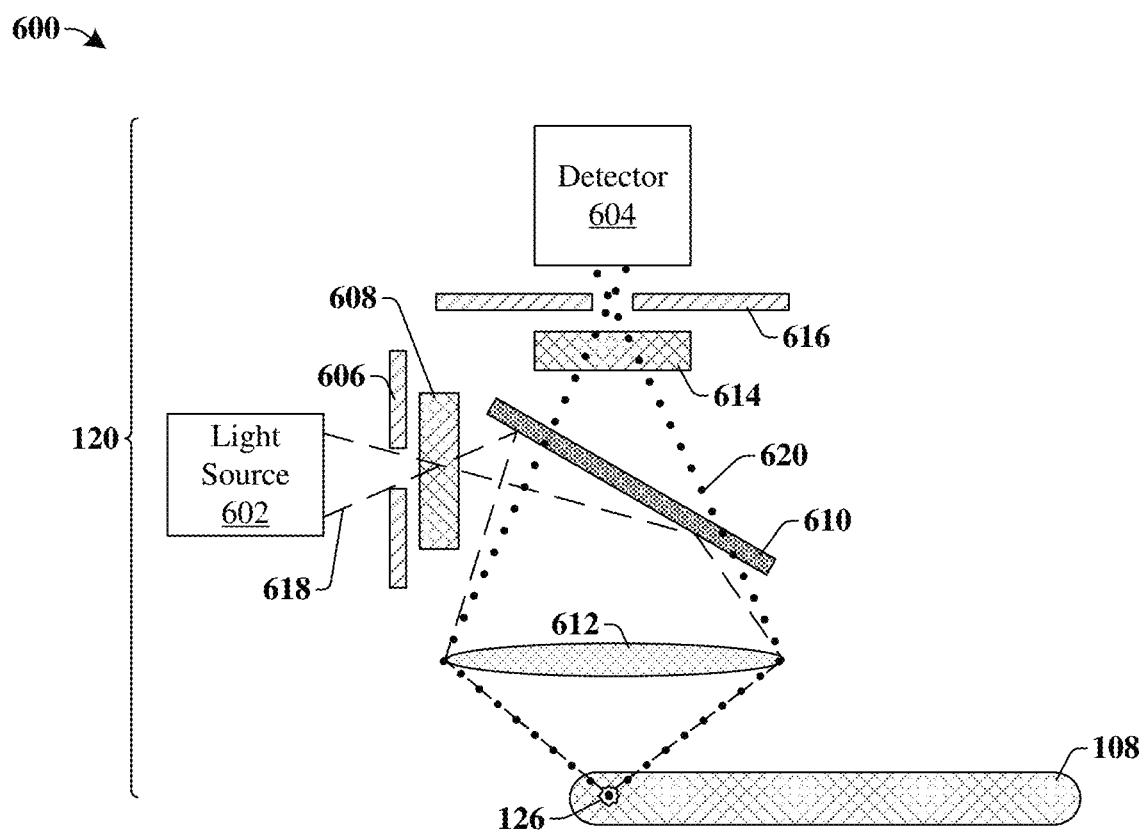
FIG. 6 illustrates a cross-sectional view of some embodiments of a laser sensor apparatus that utilizes a confocal laser to detect structural properties of a wafer structure.

FIG. 6 illustrates a cross-sectional view 600 of some embodiments of a laser sensor apparatus that utilizes a confocal laser to detect structural properties of a wafer structure.

In some embodiments, the laser sensor apparatus 120 comprises a light source 602 configured to emit an emitted laser beam 618 and a detector 604 configured to receive a received laser beam 620. In some embodiments, the laser sensor apparatus 120 comprises multiple pinholes, lenses, and mirrors to properly direct the laser beams (618, 620) between the light source 602 and the detector 604 to measure properties of the analysis area 126 of the wafer structure 108.

For example, in some embodiments, the light source 602 emits an emitted laser beam 618, as illustrated by a hashed line, at a certain wavelength that is directed towards a dichroic mirror 610 using a first confocal pinhole structure 606. In some embodiments, the emitted laser beam 618 also travels through an excitation light filter 608 arranged between the first confocal pinhole structure 606 and the dichroic mirror 610. In some embodiments, the emitted laser beam 618 reflects off of the dichroic mirror 610 and is focused towards the analysis area 126 of the wafer structure 108 using an objective lens 612. In some embodiments, the received laser beam 620, as illustrated by a dotted line, then reflects off of the analysis area 126 of the wafer structure 108, travels through the objective lens 612, the dichroic mirror 610, an emission light filter 614, and a second pinhole structure 616 to be received by the detector 604. In some embodiments, the wavelength of the received laser beam 620 corresponds to a crystal structure of the analysis area 126 of the wafer structure 108. In some embodiments, the wavelength of the emitted laser beam 618, the configuration of the pinholes, lenses, and mirrors, and/or the location of the laser sensor apparatus 120 with respect to the wafer structure 108 can be changed to change the properties of the wafer structure 108 to be measured and/or to change the desired location of the analysis area 126.

Figure 7:
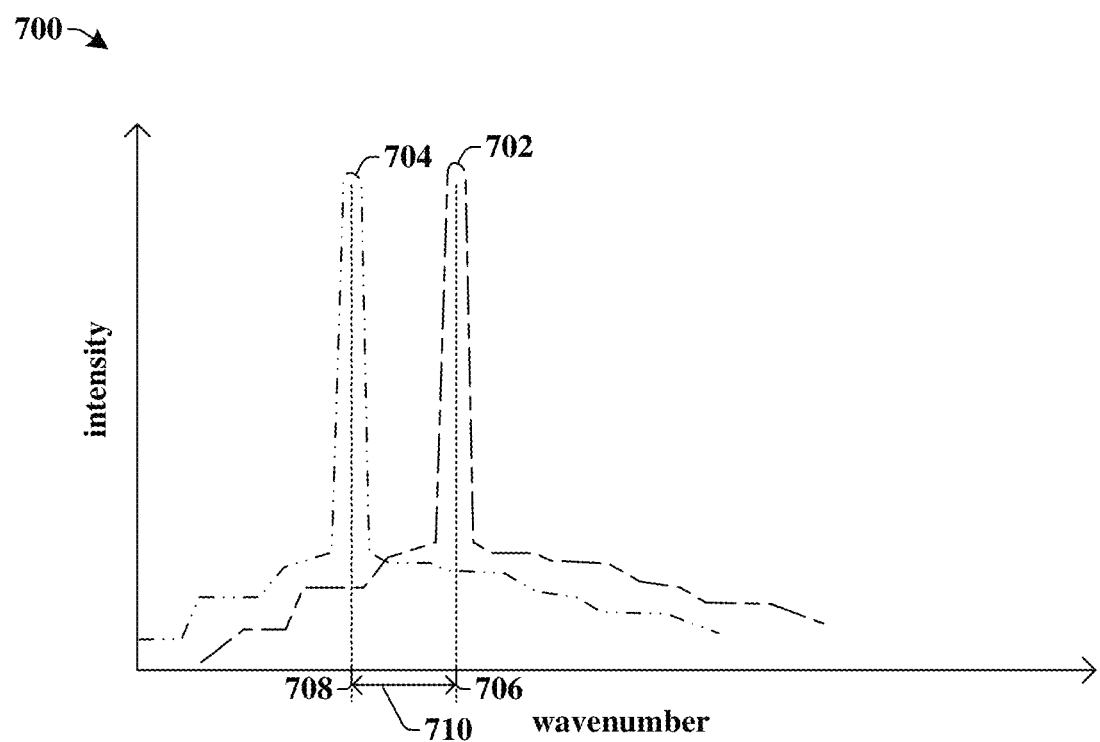
FIG. 7 illustrates a diagram of some embodiments of Raman intensity curves measured by confocal laser scanning microscopy to illustrate a Raman peak shift.

FIG. 7 illustrates a diagram 700 of some embodiments of Raman intensity curves as measured by confocal laser scanning microscopy.

The diagram 700 of FIG. 7 illustrates the Raman intensity vs. wavenumber of produced during CLSM processes. In some embodiments, the laser sensor apparatus (120 of FIG. 1) measures Raman intensity curves of the analysis area (126 of FIG. 1) of the wafer structure (108 of FIG. 1). In some embodiments, the Raman intensity curves correspond to the bonds of the crystal structure of the analysis area (126 of FIG. 1). In some embodiments, a change in a Raman peak indicates a change in stress (e.g., tensile stress, compressive stress, etc.) within the crystal structure of the analysis area (126 of FIG. 1) of the wafer structure (108 of FIG. 1).

In some embodiments, prior to the wafer edge trimming process, the wafer structure 108 may have a first Raman intensity curve 702 indicating some an average amount of acceptable stress within the wafer structure 108. In some such embodiments, a peak of the first Raman intensity curve 702 indicating the average amount of acceptable stress (e.g., not prone to damage) is equal to a predetermined threshold value 706. In some embodiments, during the wafer edge trimming process, the wafer structure 108 may have a second Raman intensity curve 704 that is measured in real-time by the laser sensor apparatus (120 of FIG. 1) that indicates a change in stress within the wafer structure 108. In some embodiments, a peak of the second Raman intensity curve 704 is equal to a second peak value 708. In some embodiments, the change in stress indicates that the wafer structure 108 is prone to damage when a difference 710 between the predetermined threshold value 706 and the second peak value 708 is greater than the predetermined shift value.

Thus, when the peak of the second, real-time Raman intensity curve 704 shifts in the positive or negative direction from the peak of the first Raman intensity curve 702 by an amount greater than the predetermined shift value during the wafer edge trimming process, the control circuitry (122 of FIG. 1) implements the damage prevention process to prevent damage to the wafer structure 108. When the peak of the second, real-time Raman intensity curve 704 shifts closer to the peak of the first Raman intensity curve 702 by an amount less than the predetermined shift value during the wafer edge trimming process, then the control circuitry (122 of FIG. 1) can return back to its original processing conditions.

It will be appreciated that the Raman intensity curves of FIG. 7 are one of many types of data collected by the laser sensor apparatus (120 of FIG. 1). In some other embodiments, the laser sensor apparatus (120 of FIG. 1) may measure topography of the wafer structure 108 that also indicates when the wafer structure 108 is prone to damage by some change from a predetermined threshold value that is greater than a predetermined shift value.

Figure 8:
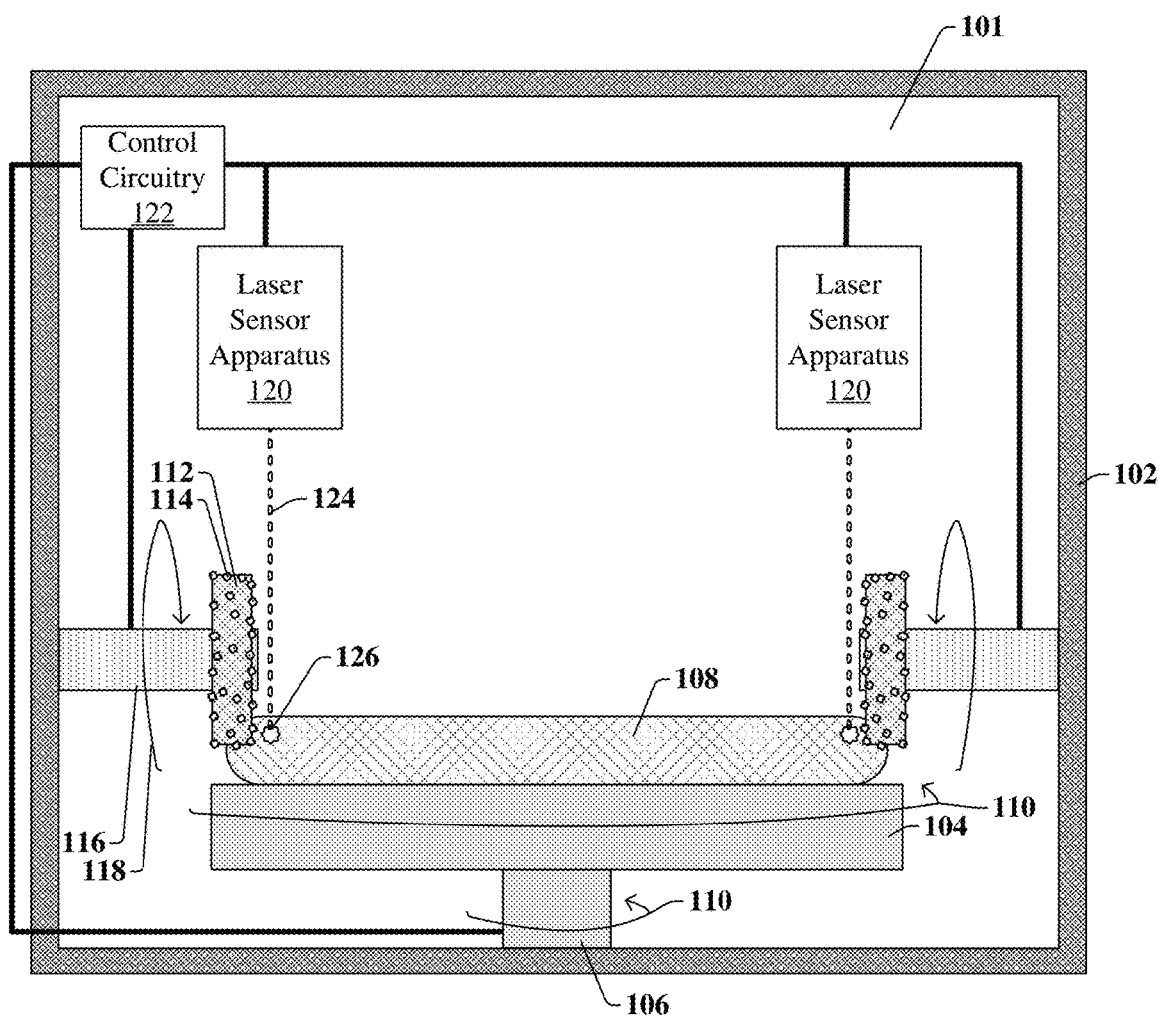
FIGS. 8 and 9 illustrate cross-sectional views of some other embodiments of a wafer edge trimming apparatus comprising a laser sensor apparatus arranged over a wafer chuck and beside a blade that is configured to measure parameters of a wafer structure on the wafer chuck to mitigate damage to the wafer structure during wafer edge trimming.

FIG. 8 illustrates a cross-sectional view 800 of some other embodiments of a wafer edge trimming apparatus comprising a laser sensor apparatus and two blades over a wafer chuck.

In some other embodiments, the processing chamber 101 may comprise multiple blades 112 for a wafer edge trimming process. The multiple blades 112 may be used to trim different depths and/or different widths of the wafer structure 108 during some embodiments of a wafer edge trimming process. In some embodiments, a laser sensor apparatus 120 is present for each blade 112 such that damage prevention processes may be implemented by control circuitry 122 when at least one of the laser sensor apparatuses 120 indicate a damage-prone region of the wafer structure 108.

Figure 9:
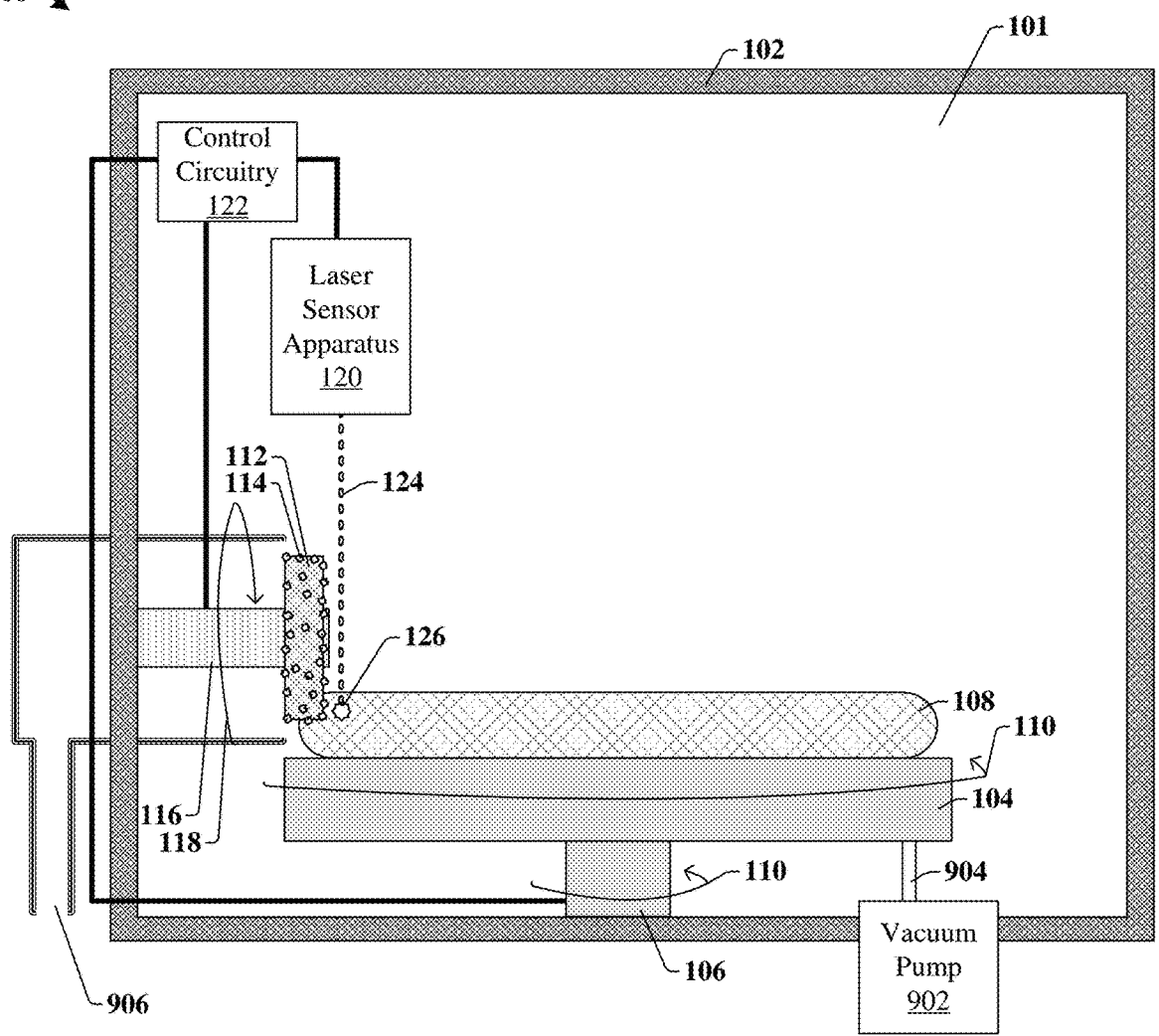

FIG. 9 illustrates a cross-sectional view 900 of some other embodiments of a wafer edge trimming apparatus comprising output piping around the blade to remove particles produced during the wafer edge trimming process.

In some embodiments, a wafer edge trimming apparatus further comprises an output piping 906 arranged around the blade 112 to remove particles of the wafer structure 108 during the wafer edge trimming process. The output piping 906 aids in damage prevention such that the particles of the wafer structure 108 do not scratch and/or contaminant the wafer structure 108. Further, in some embodiments, a vacuum pump 902 is coupled to the wafer chuck 104 through vacuum piping 904 to securely hold the wafer structure 108 onto the wafer chuck 104 through vacuum suction.

Figure 10:
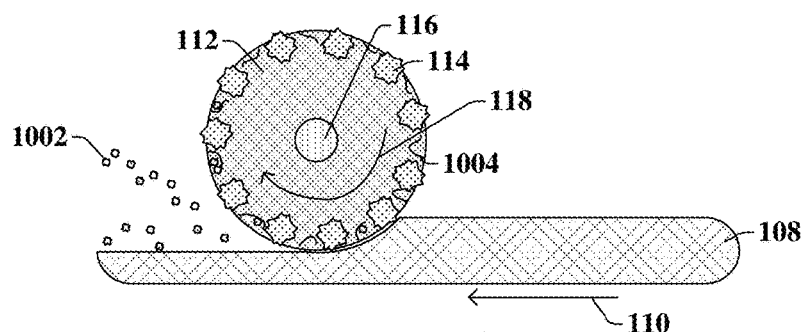
FIG. 10 illustrates a cross-sectional view of some embodiments of a blade removing an edge portion of a wafer structure through wafer edge trimming.

FIG. 10 illustrates a cross-sectional view 1000 of some embodiments of a blade removing an edge portion of a wafer structure through wafer edge trimming, wherein the blade comprises pockets to collect particles produced during the wafer edge trimming process.

FIG. 10 illustrates particles 1002 of the wafer structure 108 that are present as the wafer edge trimming process removes an edge portion of the wafer structure 108. In some embodiments, the blade 112 may comprise chip pockets 1004 configured to collect some of the particles 1002 during the wafer edge trimming process to prevent the particles 1002 from scratching and/or contaminating the wafer structure 108. Thus, in some embodiments, one or more particle removal techniques (e.g., chip pockets 1004 of FIG. 10, output piping 906 of FIG. 9, etc.) may be used in the wafer edge trimming apparatus to prevent damage to the wafer structure 108 from the particles 1002 produced during trimming.

Further, in some embodiments, the blade 112 may be rotated 118 by the second spindle 116 in a clockwise direction while the wafer structure 108 is rotated 110 from the right to the left from the cross-sectional view 1000 of FIG. 10. Such rotation relationship between the blade 112 and the wafer structure 108 is known as down-cut mode. In some other embodiments, the blade 112 may be rotated 118 by the second spindle 116 in a clockwise direction while the wafer structure 108 is rotated 110 from the left to the right (not shown). Such rotation relationship between the blade 112 and the wafer structure 108 is known as up-cut mode. In some embodiments, the down-cut mode has a higher risk of cracking but a lower risk of peeling than the up-cut mode. However, because the laser sensor apparatus (120 of FIG. 1) can detect when damage (e.g., cracking, peeling) may occur, the down-cut mode or the up-cut mode may be used in the wafer edge trimming process.

Figure 11:
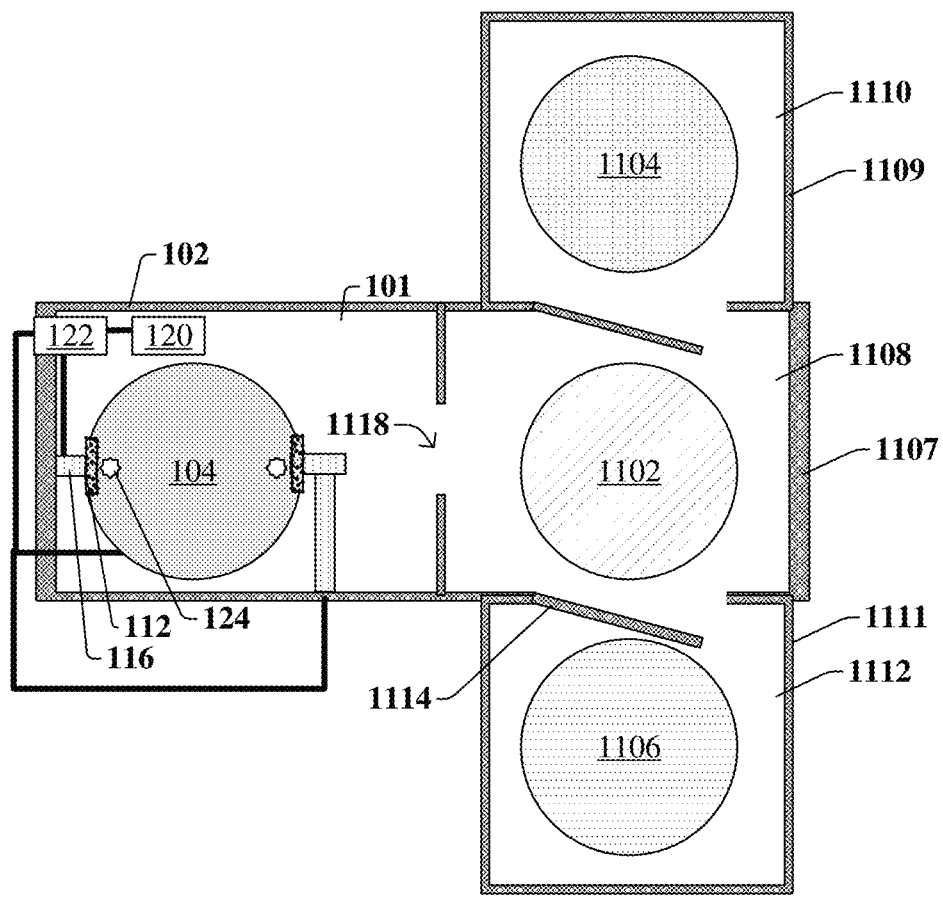
FIG. 11 illustrates a top-view of some embodiments of a wafer edge trimming chamber coupled to other processing chambers.

FIG. 11 illustrates a top-view 1100 of some embodiments of a wafer edge trimming chamber coupled to other processing chambers.

In some embodiments, the processing chamber 101 of the wafer edge trimming apparatus defined by chamber housing 102 is coupled to a cleaning processing chamber 1110 defined by cleaning chamber housing 1109, a buffer processing chamber 1108 defined by buffer chamber housing 1107, and a wafer storage chamber 1112 defined by storage chamber housing 1111. In some embodiments, the cleaning processing chamber 1110 comprises a cleaning wafer chuck 1104; the buffer processing chamber 1108 comprises a buffer wafer chuck 1102; and the wafer storage chamber 1112 comprises one or more storage wafer chucks 1106. In some embodiments, doors 1114 and/or openings 1118 may be arranged between each chamber housing (102, 1107, 1109, 1111) to be open and closed during the different processes that are conducted in each chamber (101, 1108, 1110, 1112).

In some embodiments, the wafer structure (108 of FIG. 1) may originate in the wafer storage chamber 1112. In some embodiments, the wafer storage chamber 1112 and storage chamber housing 1111 may be or comprise cassettes, a front opening unified pod (FOUP), or some other storage structure that may hold multiple wafer structures (108 of FIG. 1) on multiple storage wafer chucks 1106. Thus, in some embodiments, the storage chamber housing 1111 is a moveable pod that may be interchanged with a new storage chamber housing 1111 to continuously process more wafer structures (108 of FIG. 1).

In some embodiments, a wafer structure (108 of FIG. 1) is transported between the storage chamber housing 1111 to the buffer processing chamber 1108 before being transported into the processing chamber 101 for wafer edge trimming processing. In some embodiments, the wafer structure (108 of FIG. 1) is then transported back to the buffer processing chamber 1108 after wafer edge trimming processing and into the cleaning processing chamber 1110. In some embodiments, the cleaning processing chamber 1110 is configured to conduct a cleaning process to remove any particles (1002 of FIG. 10) on the wafer structure (108 of FIG. 1) from wafer edge trimming. In some embodiments, the cleaning processing chamber 1110 is configured to apply a cleaning solution to the wafer structure (108 of FIG. 1) as the cleaning wafer chuck 1104 spins the wafer structure (108 of FIG. 1) to remove the cleaning solution and the particles (1002 of FIG. 10) and to dry the wafer structure (108 of FIG. 1).

In some embodiments, after the cleaning process, the wafer structure (108 of FIG. 10) is transported from the cleaning processing chamber 1110 back to the storage chamber housing 1111. In some embodiments, once all wafer structures (108 of FIG. 10) are returned to the storage chamber housing 1111 after wafer edge trimming and cleaning processes, a new storage chamber housing 1111 is coupled to the buffer chamber housing 1107 to conduct the wafer edge trimming process to more wafer structures (108 of FIG. 1).

FIGS. 12A-16 illustrate various views 1200A-1600 of some embodiments a method of performing a wafer edge trimming process, wherein a laser sensor apparatus detects when a wafer structure is prone to damage such that control circuitry can adjust the wafer edge trimming process conditions to prevent or mitigate damage to the wafer structure. Although FIGS. 12A-16 are described in relation to a method, it will be appreciated that the structures disclosed in FIGS. 12A-16 are not limited to such a method, but instead may stand alone as structures independent of the method.

Figure 12A:
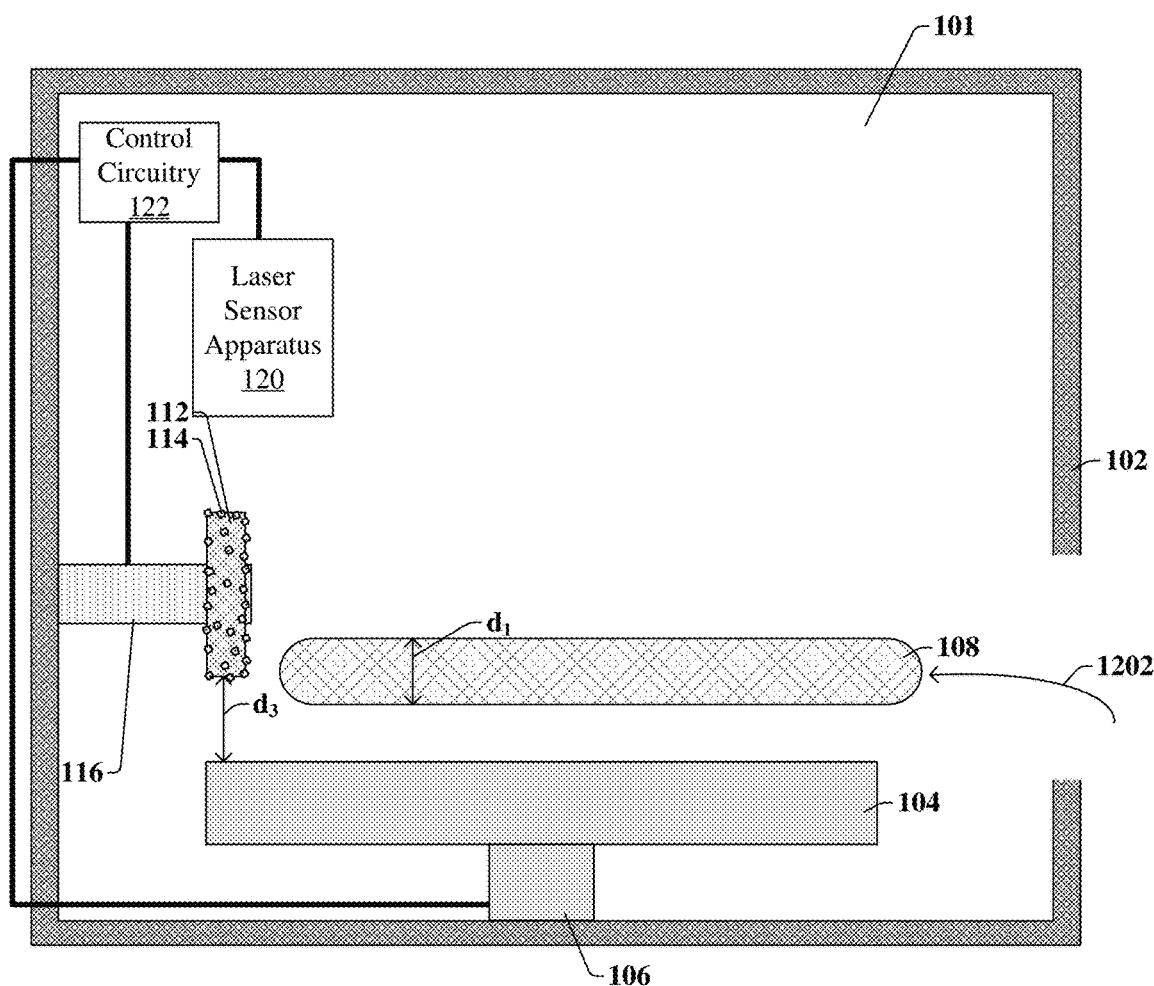
FIGS. 12A-16 illustrate various views of some embodiments of a method of performing a wafer edge trimming process, wherein a laser sensor apparatus detects when a wafer structure is prone to damage such that control circuitry can adjust the wafer edge trimming process conditions to mitigate damage to the wafer structure.

As shown in cross-sectional view 1200A of FIG. 12A, in some embodiments, a wafer structure 108 is loaded 1202 into a processing chamber 101 defined by chamber housing 102 and onto a wafer chuck 104 within the processing chamber 101. In some embodiments, the wafer structure 108 may be loaded 1202 into the processing chamber 101 by a robotic arm (not shown) or some other wafer transport tool. In some embodiments, the wafer structure 108 is loaded into the processing chamber 101 from some other chamber such as a buffer processing chamber (1108 of FIG. 11), a wafer storage chamber (1112 of FIG. 11), a cleaning processing chamber (1110 of FIG. 11), or some other suitable chamber. In some embodiments, the wafer structure 108 comprises any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. Thus, in some embodiments, the wafer structure 108 may comprise a single wafer or a stack of multiple wafers bonded to one another. In some embodiments, the wafer structure 108 has a thickness equal to a first distance $d_1$.

In some embodiments, the wafer chuck 104 is arranged near a bottom of the processing chamber 101 and is coupled to a first spindle 106 configured to rotate the wafer chuck 104 during processing. In some embodiments, the wafer chuck 104 is configured to securely hold onto the wafer structure 108 during processing. In some embodiments, for example, the wafer chuck 104 may be an electrostatic chuck that utilizes electrostatic forces to hold the wafer structure 108 onto the wafer chuck 104; the wafer chuck 104 may be coupled to a vacuum pump (e.g., 902 of FIG. 9) configured to hold the wafer structure 108 through vacuum piping (e.g., 904 of FIG. 9); or the wafer chuck 104 may use some other suitable mechanism to hold onto the wafer structure 108 during processing.

In some embodiments, the processing chamber 101 further comprises a blade 112 coupled to a second spindle 116, wherein the second spindle 116 is configured to rotate the blade 112 during processing. In some embodiments, as the wafer structure 108 is being loaded 1202 onto the wafer chuck 104, a bottom of the blade 112 is spaced apart from the wafer chuck 104 by a third distance $d_3$ that is greater than the first distance $d_1$ such that the wafer structure 108 can be loaded onto the wafer chuck 104 without interference from the blade 112. In some embodiments, the blade 112 comprises diamonds 114 embedded in the blade 112 to aid in the precision and accuracy of the cut provided by the blade 112. In some other embodiments, the blade 112 may comprise other materials than diamonds 114. The blade 112 is arranged over the wafer chuck 104 and is configured to remove an edge portion of the wafer structure 108 as the wafer structure 108 is exposed to the blade 112 and as the wafer chuck 104 rotates.

In some embodiments, a laser sensor apparatus 120 is arranged over the wafer chuck 104 and is arranged between a center of the wafer chuck 104 and the blade 112. In some embodiments, the laser sensor apparatus 120 is configured to direct a confocal laser beam towards the wafer chuck 104 to measure parameters of the wafer structure 108 arranged on the wafer chuck 104 while (e.g., at the same time as) the blade 112 is trimming a damaged edge portion of the wafer structure 108. In some embodiments, the first spindle 106, the second spindle 116, and/or the laser sensor apparatus 120 are coupled to control circuitry 122 either through wires or wirelessly (not shown). In some embodiments, the control circuitry 122 can control the rotational speeds of the first and second spindles 106, 116, as well as control the power and data processing of the laser sensor apparatus 120. In some embodiments, the control circuitry 122 is configured to implement a damage prevention process during the wafer edge trimming process when the laser sensor apparatus 120 detects a damage-prone region of the wafer structure 108 during trimming by the blade 112.

Figure 12B:
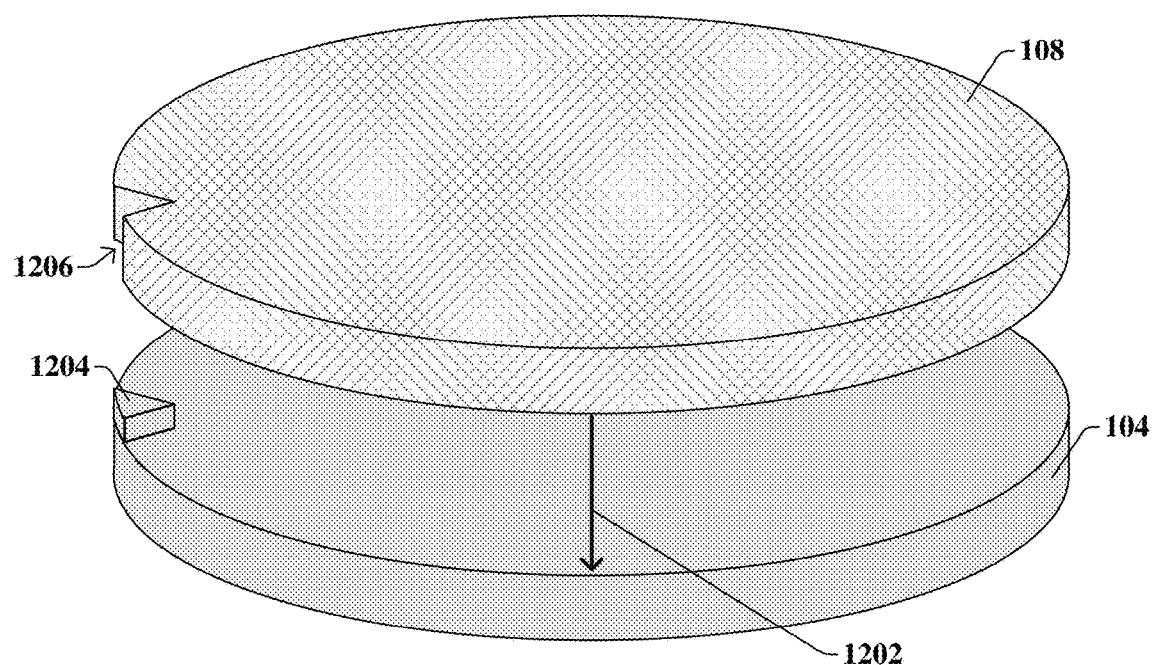

As shown in perspective view 1200B of FIG. 12B, in some embodiments, the wafer structure 108 is aligned to the wafer chuck 104 as the wafer structure 108 is loaded 1202 onto the wafer chuck 104 through a notch-protrusion alignment process. The perspective view 1200B of FIG. 12B only shows the wafer structure 108 and the wafer chuck 104 of the processing chamber (101 of FIG. 12A) for simplicity in showing the notch-protrusion alignment process. In some such embodiments, the wafer structure 108 comprises a notch 1206, which is an indent near an edge of the wafer structure 108. In some embodiments, the wafer chuck 104 comprises a protrusion 1204, which protrudes from an upper surface of the wafer chuck 104. In some embodiments, the notch 1206 of the wafer structure 108 and the protrusion 1204 of the wafer chuck 104 comprise a same shape from a top-view perspective. For example, in FIG. 12B, the notch 1206 and the protrusion 1204 may exhibit triangle-like shapes from a top-view. In other embodiments, the notch 1206 and the protrusion 1204 may exhibit a semi-circle, a rectangle, a square, or some other shape from the top-view.

In some embodiments, the notch 1206 of the wafer structure 108 is aligned with the protrusion 1204 of the wafer chuck 104 using a camera, a laser, and/or a transport robot. The wafer structure 108 is aligned onto the wafer chuck 104 such that the desired edge portion of the wafer structure 108 is removed from the wafer structure 108 by the wafer edge trimming process. If the wafer structure 108 is misaligned over the wafer chuck 104, then more or less of the wafer structure 108 may be removed than what is desired. It will be appreciated that other alignment methods, such as upper surface wafer alignment marks, may be used to align the wafer structure 108 over the wafer chuck 104.

Figure 13:
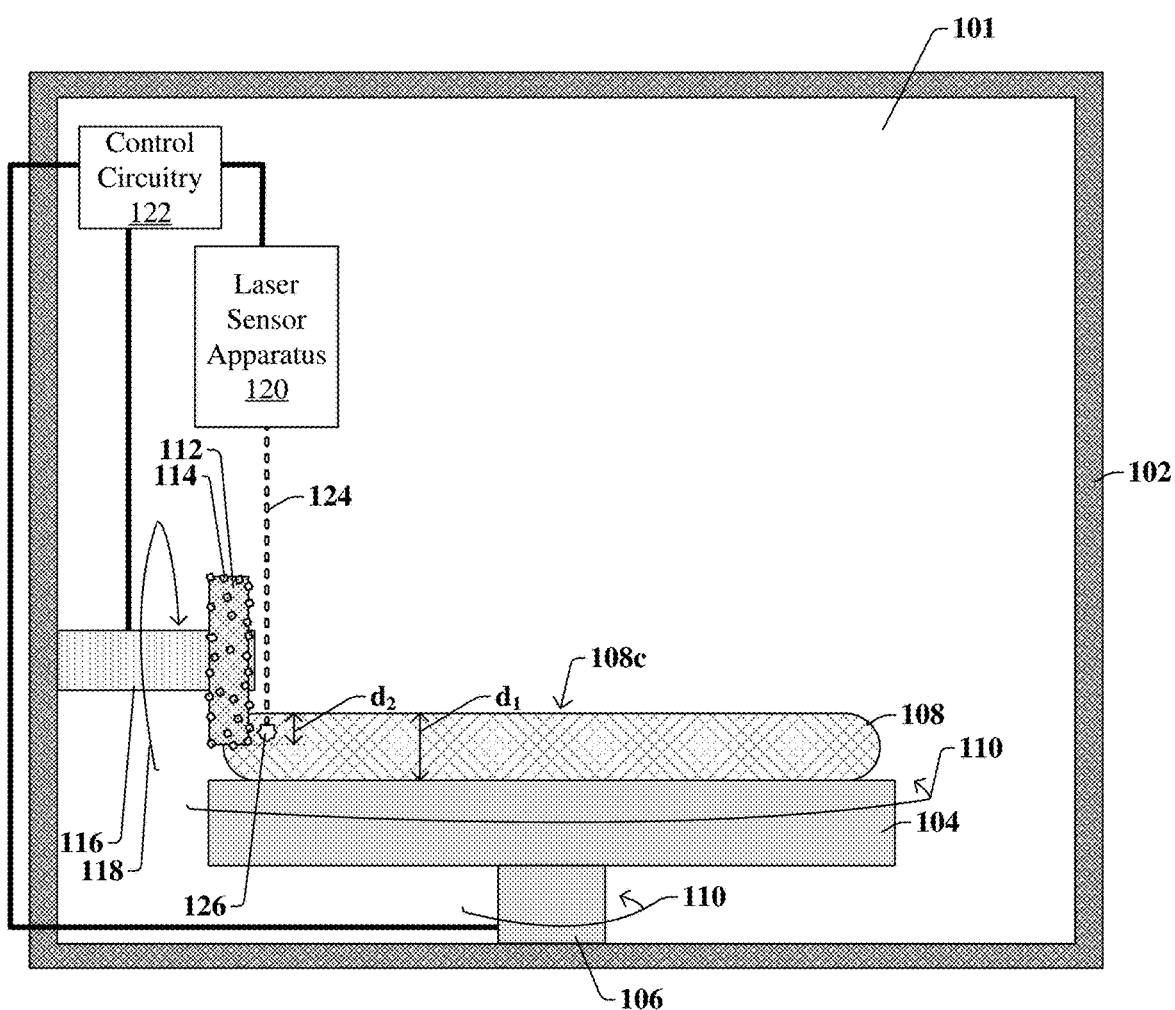

As shown in cross-sectional view 1300 of FIG. 13, in some embodiments, the control circuitry 122 turns "ON" the first spindle 106, the second spindle 116, and the laser sensor apparatus 120. In some embodiments, the first spindle 106 and corresponding blade 112 are turned "ON" by the control circuitry 122 and moved toward the wafer structure 108 and arranged at a trim depth equal to a second distance $d_2$. In some embodiments, the trim depth is defined by the second distance $d_2$ between a topmost surface of the wafer structure 108 and a bottommost surface of the blade 112. In some embodiments, the second distance $d_2$ (e.g., the trim depth) is less than to the first distance $d_1$ (e.g., a thickness of the wafer structure 108). In some other embodiments, the second distance $d_2$ (e.g., the trim depth) is greater than or equal to the first distance $d_1$ (e.g., a thickness of the wafer structure 108).

In some embodiments, the control circuitry 122 begins the wafer edge trimming process at a first set of trimming conditions, wherein the first spindle 106 is set to rotate 110 at a first rotational speed, and wherein the second spindle 116 is set to rotate 118 at a second rotational speed. Additionally, in some embodiments, the first set of trimming conditions controlled by the control circuitry 122 may include first settings of the temperature, pressure, and/or other conditions of the processing chamber 101.

In some embodiments, as the blade 112 is rotating 118 and the wafer structure 108 is rotating 110, the laser sensor apparatus 120 is continuously measuring properties of the wafer structure 108 at the analysis area 126 of the wafer structure 108 arranged beside the blade 112 and over the wafer structure 108.

Figure 14:
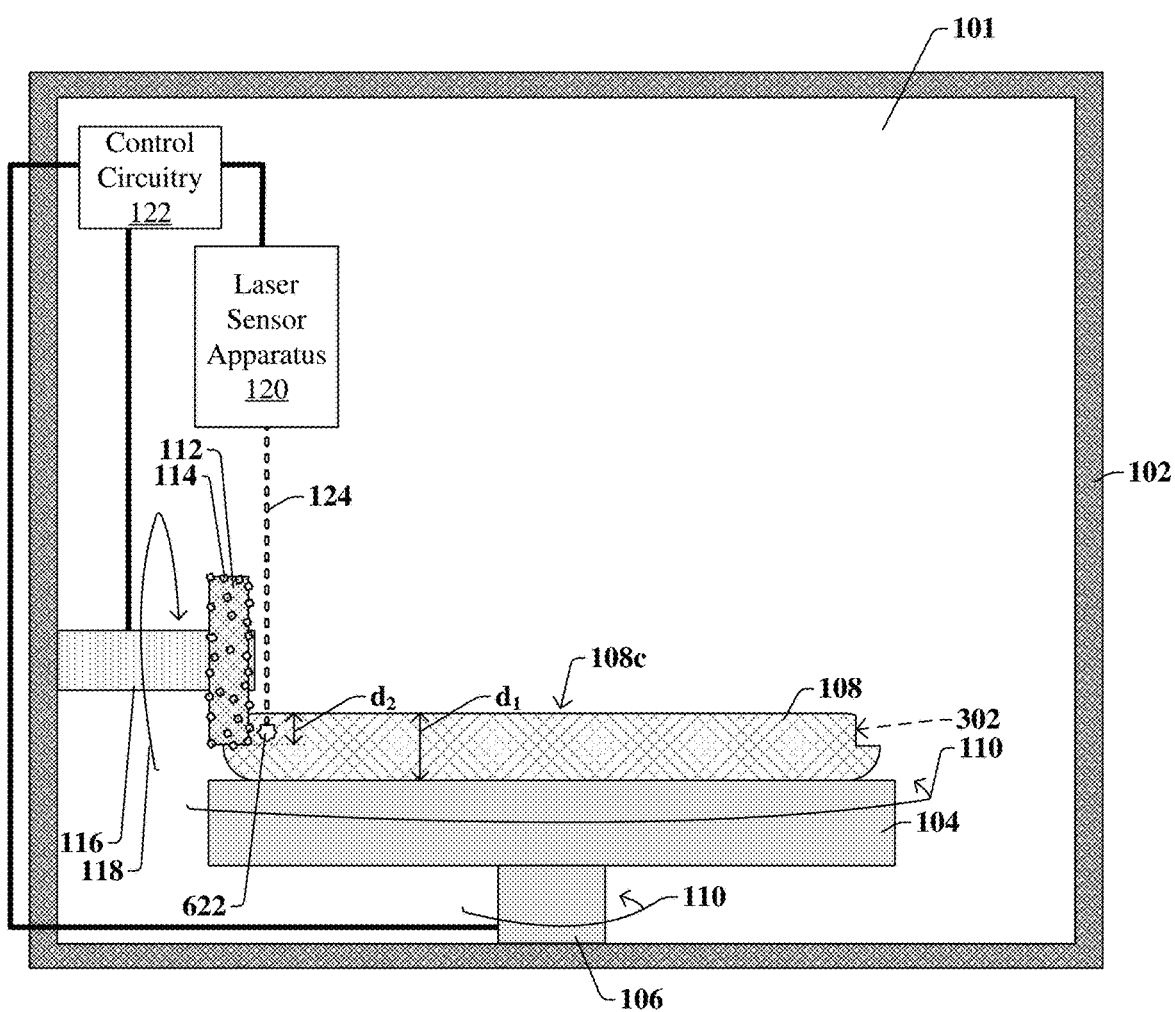

As shown in cross-sectional view 1400 of FIG. 14, as the wafer edge trimming process progresses in time between FIG. 13 and FIG. 14, a new sidewall 302 of the wafer structure 108 is formed by the blade 112. In some embodiments, during the wafer edge trimming process, the laser sensor apparatus 120 detects a parameter (e.g., stress in the crystal structure, roughness in the topography, etc.) of the wafer structure 108 that indicates damage may occur in the wafer structure 108 from the force of the blade 112. Thus, in some embodiments, when the measured parameter deviates from a predetermined threshold parameter by at least a predetermined shift value as measured by the laser sensor apparatus 120, the control circuitry 122 performs a damage prevention process using a second set of trimming conditions different than the first set of trimming conditions. In some embodiments, the second set of trimming conditions reduces the first rotational speed of the first spindle 106 and/or the second rotational speed of the second spindle 116. In some other embodiments, the second set of trimming conditions may change the pressure and/or temperature of the processing chamber 101. In yet other embodiments, the second set of trimming conditions may change some other condition of the processing chamber 101 to prevent damage to the damage-prone area of the wafer structure 108.

In some embodiments, as the laser sensor apparatus 120 continues to measure parameters of the analysis area 126 of the wafer structure 108, if the measured parameter deviates from the predetermined threshold value by an amount less than the predetermined shift value, then the control circuitry 122 may return the wafer edge trimming process back to the first set of trimming conditions. In some embodiments, the changing between the first and second set of trimming conditions continues until the edge portion of the wafer structure 108 is completely removed.

Figure 15:
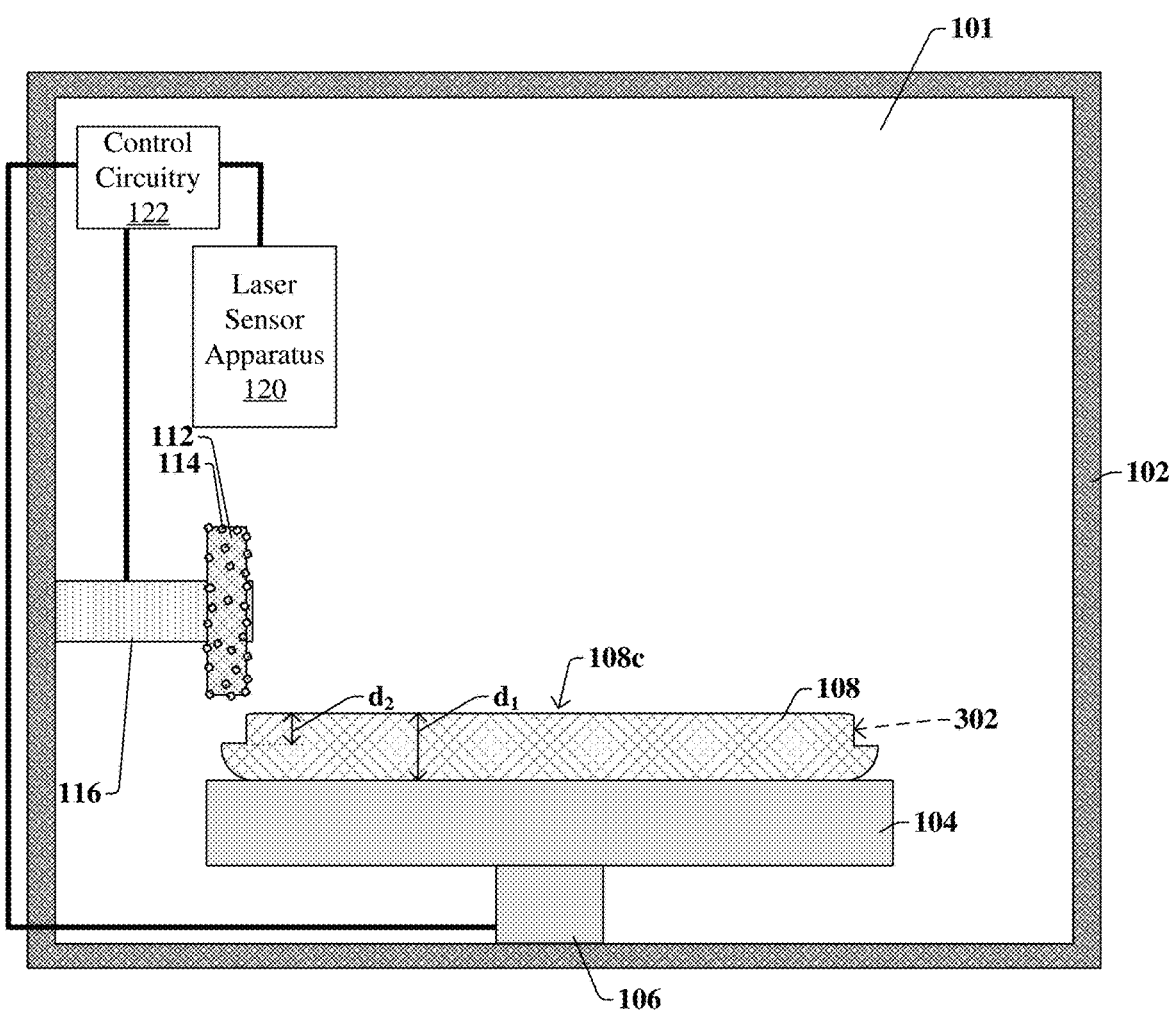

As shown in cross-sectional view 1500 of FIG. 15, in some embodiments, once the edge portion of the wafer structure 108 is completely removed, the blade 112 may be moved up and away from the wafer chuck 104. Because of the laser sensor apparatus 120 and the damage prevention process, the edge portion of the wafer structure 108 is removed without creating more damage to the wafer structure 108.

Figure 16:
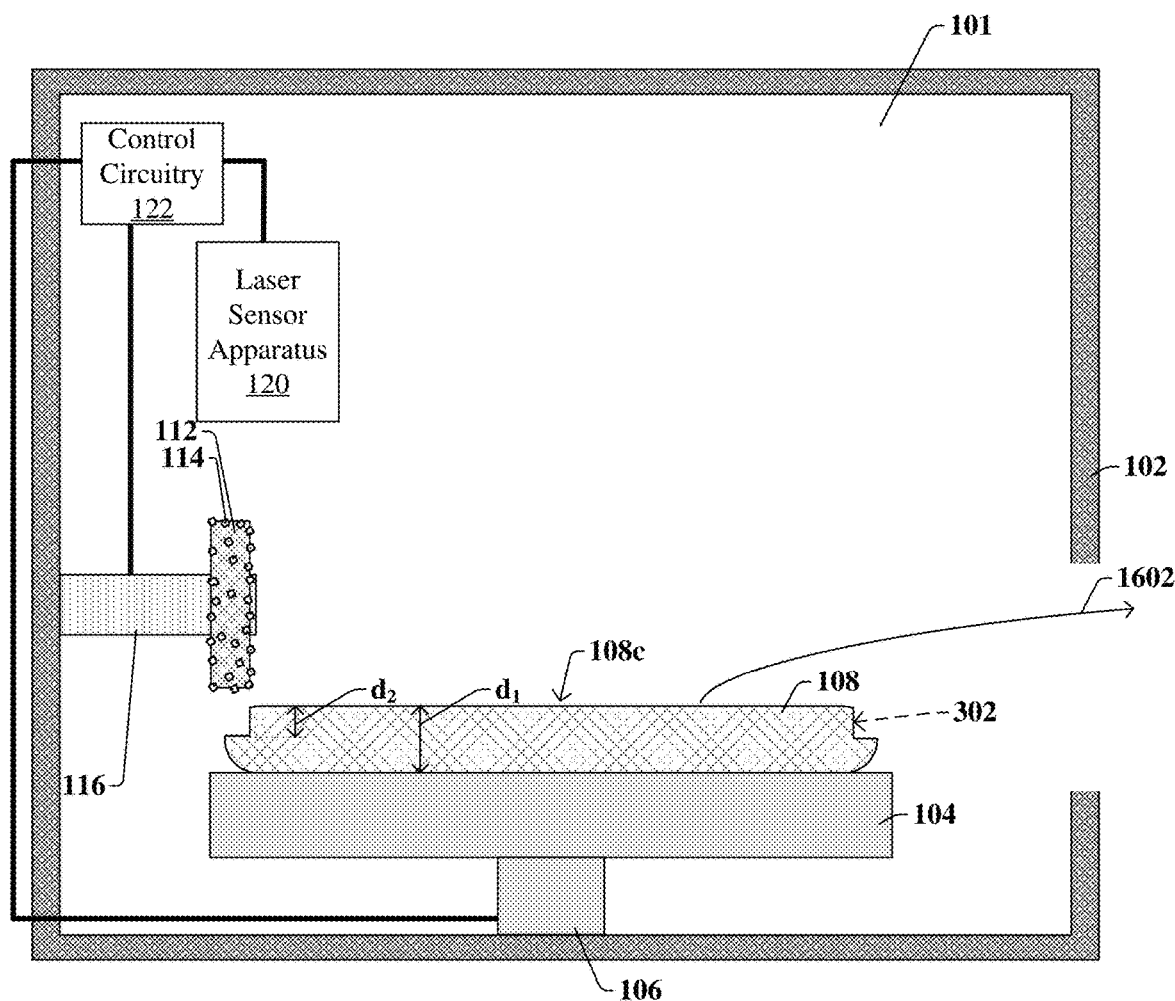

As shown in cross-sectional view 1600 of FIG. 16, in some embodiments, the wafer structure 108 may then be removed 1602 from the processing chamber 101. In some embodiments, the wafer structure 108 is removed using a robotic arm (not shown) or some other wafer transport tool. In some embodiments, the wafer structure 108 is then loaded into some other chamber such as a buffer processing chamber (1108 of FIG. 11), a wafer storage chamber (1112 of FIG. 11), a cleaning processing chamber (1110 of FIG. 11), or some other suitable chamber for further processing.

Figure 17:
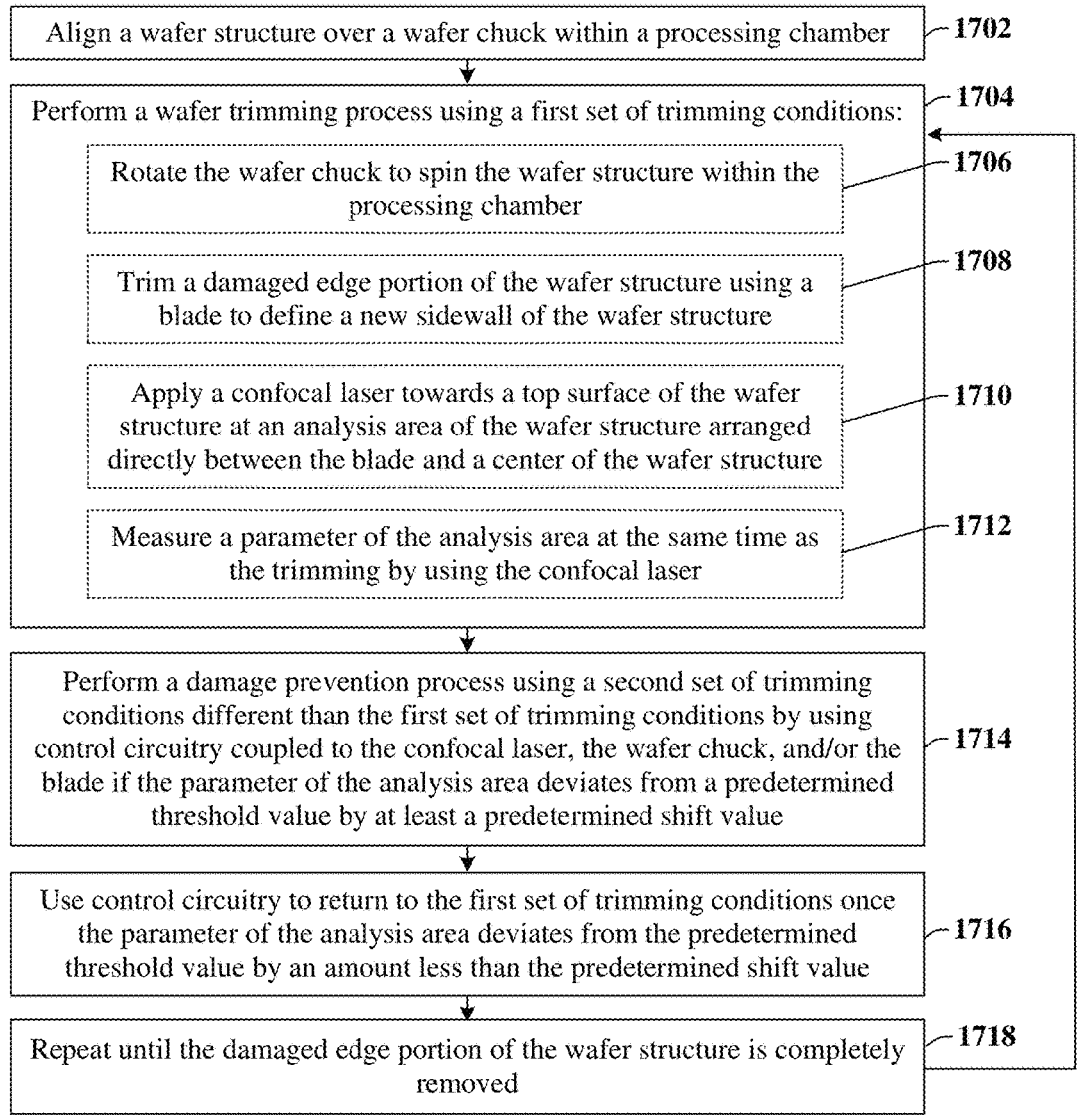
FIG. 17 illustrates a flow diagram of some embodiments of a method corresponding to the method of FIGS. 12A-16.

FIG. 17 illustrates a flow diagram of some embodiments of a method 1700 of some embodiments of a wafer edge trimming process according to the steps in FIGS. 12A-16.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, a wafer structure is aligned over a wafer chuck within a processing chamber. FIGS. 12A and 12B illustrate cross-sectional view 1200A and perspective view 1200B of some embodiments corresponding to act 1702.

At act 1704, a wafer edge trimming process is performed using a first set of trimming conditions.

At act 1706, the wafer chuck is rotated to spin the wafer structure within the processing chamber.

At act 1708, a damaged edge portion of the wafer structure is trimmed suing a blade to define a new sidewall of the wafer structure.

At act 1710, a confocal laser is applied towards a top surface of the wafer structure at an analysis area of the wafer structure that is arranged directly between the blade and a center of the wafer structure.

At act 1712, a parameter of the analysis area is measured at a same time as the trimming by using the confocal laser. FIG. 13 illustrates cross-sectional view 1300 of some embodiments corresponding to acts 1704, 1706, 1708, 1710, and 1712.

At act 1714, a damage prevention process is performed using a second set of trimming conditions different than the first set of trimming conditions according to control circuitry coupled to the confocal laser, the wafer chuck, and/or the blade if the parameter of the analysis area deviates from a predetermined threshold value by a predetermined shift value. FIG. 13 illustrates a cross-sectional view 1300 of some embodiments that also corresponds to act 1714. Further, FIG. 7 illustrates a diagram 700 of some embodiments related to act 1714.

At act 1716, the control circuitry is used to return the trimming conditions back to the first set of trimming conditions once the parameter of the analysis area deviates from the predetermined threshold value by an amount less than the predetermined shift value.

At act 1718, steps 1704-1716 are repeated until the damaged edge portion of the wafer structure is completely removed. FIG. 15 illustrates a cross-sectional view 1500 of some embodiments corresponding to acts 1716 and 1718.

Therefore, the present disclosure relates to a wafer edge trimming apparatus comprising a laser sensor apparatus arranged between a blade and a center of a wafer chuck, wherein during a wafer edge trimming process, the laser sensor apparatus is configured to detect when the wafer structure is about to become damaged such that a damage prevention process can be implemented to avoid damage to the wafer structure.

Accordingly, in some embodiments, the present disclosure relates to a wafer edge trimming apparatus comprising: a processing chamber defined by chamber housing; a wafer chuck arranged within the processing chamber and configured to hold onto a wafer structure; a blade arranged near an edge of the wafer chuck and configured to remove an edge portion of a wafer structure and to define a new sidewall of the wafer structure; a laser sensor apparatus configured to direct a laser beam directed toward a top surface of the wafer chuck and between the edge of the wafer chuck and a center of the wafer chuck, wherein the laser sensor apparatus is configured to measure a parameter of an analysis area of the wafer structure; and control circuitry coupled to the laser sensor apparatus and the blade, wherein the control circuitry is configured to start a damage prevention process when the parameter deviates from a predetermined threshold value by at least a predetermined shift value.

In other embodiments, the present disclosure relates to a wafer edge trimming apparatus comprising: a processing chamber defined by chamber housing; a wafer chuck arranged within the processing chamber configured to support a wafer structure; a blade configured to remove a damaged edge portion of the wafer structure from an undamaged edge portion of the wafer structure, wherein removal of the damaged edge portion by the blade defines a new sidewall of the wafer structure; a spindle coupled to the blade and configured to rotate the blade during the removal of the damaged edge portion of the wafer structure; and a laser sensor apparatus arranged over the wafer chuck and configured to direct a laser beam toward an analysis area of the undamaged edge portion of the wafer structure, wherein the analysis area of the undamaged edge portion of the wafer structure is arranged laterally beside the blade, wherein the laser sensor apparatus is configured to measure a parameter of the analysis area of the wafer structure during the removal of the damaged edge portion.

In yet other embodiments, the present disclosure relates to a method comprising: aligning a wafer structure over a wafer chuck within a processing chamber; rotating the wafer chuck to spin the wafer structure within the processing chamber; trimming and removing an edge portion of the wafer using a blade to define a new sidewall of the wafer structure; applying a confocal laser beam to a top surface of the wafer structure at an analysis area of the wafer structure arranged directly between the blade and a center of the wafer structure, wherein the analysis area is arranged closer to the blade than the center of the wafer structure; measuring a parameter of the analysis area at the same time as the trimming by using a laser sensor apparatus that applies the confocal laser beam; and performing a damage prevention process using control circuitry coupled to the laser sensor apparatus, the wafer chuck, and/or the blade if the parameter of the analysis area deviates from a predetermined threshold value by at least a predetermined shift value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
aligning a wafer structure over a wafer chuck within a processing chamber;
rotating the wafer chuck to spin the wafer structure within the processing chamber;

trimming and removing an edge portion of the wafer structure using a blade to define a new sidewall of the wafer structure;

applying a confocal laser beam to a top surface of the wafer structure at an analysis area of the wafer structure arranged directly between the blade and a center of the wafer structure, wherein the analysis area is arranged closer to the blade than the center of the wafer structure;

measuring a parameter of the analysis area at the same time as the trimming by using a laser sensor apparatus that applies the confocal laser beam; and performing a damage prevention process using control circuitry coupled to the laser sensor apparatus, the wafer chuck, and/or the blade if the parameter of the analysis area deviates from a predetermined threshold value by at least a predetermined shift value.

2. The method of claim 1, wherein the damage prevention process comprises:
reducing a rotation speed of the blade.

3. The method of claim 1, wherein the damage prevention process comprises:
reducing a rotation speed of the wafer chuck.

4. The method of claim 1, wherein the parameter is a measurement of stress within the analysis area of the wafer structure.

5. The method of claim 1, wherein the measuring of the parameter is conducted using confocal laser scanning microscopy.

6. The method of claim 1, wherein the predetermined threshold value is a Raman peak intensity value indicating a first amount of stress within the analysis area of the wafer structure, and wherein the predetermined shift value indicates that a second amount of stress within the analysis area of the wafer structure that is greater than the first amount of stress.

7. A method comprising:
aligning a wafer over a wafer chuck within a processing chamber, the wafer having thickness defined between an upper surface of the wafer and a lower surface of the wafer, the upper surface and the lower surface terminating at a circumferential edge that surrounds a central axis of the wafer;

using a rotating blade having a first rotational speed to remove an annular portion of the upper surface of the wafer to thereby define an annular ledge that is recessed relative to the upper surface of the wafer along the circumferential edge of the wafer;

as the rotating blade is removing the annular portion of the upper surface of the wafer, measuring a lattice stress condition in an area of the wafer adjacent to the rotating blade; and reducing the first rotational speed of the rotating blade to a second rotational speed when the lattice stress condition measured in the area of the of the wafer adjacent to the rotating blade is greater than a predetermined stress threshold.

8. The method of claim 7, wherein the wafer chuck rotates such that the wafer is rotated about the central axis at a third rotational speed within the processing chamber.

9. The method of claim 8, further comprising:
reducing a rotational speed of the wafer chuck when the lattice stress condition measured in the area of the of the wafer adjacent to the rotating blade is greater than the predetermined stress threshold, such that after the rotational speed of the wafer chuck is reduced the wafer is rotated about the central axis at a fourth rotational speed that is less than the third rotational speed.

10. The method of claim 7, wherein the measuring of the lattice stress condition is performed using confocal laser scanning microscopy.

11. The method of claim 10, wherein the predetermined stress threshold is a Raman peak intensity value measured by the confocal laser scanning microscopy.

12. The method of claim 7, further comprising cleaning the wafer after the removal of the annular portion of the upper surface of the wafer.

13. The method of claim 7, wherein the rotating blade comprises a spindle having an axis about which the rotating blade rotates, and wherein the axis of the spindle is fixed with regards to a location on a sidewall of the processing chamber.

14. A method comprising:
aligning a wafer over a wafer chuck within a processing chamber, the wafer having thickness defined between an upper surface of the wafer and a lower surface of the wafer, the upper surface and the lower surface terminating at a circumferential edge that surrounds a central axis of the wafer;

rotating the wafer chuck and the wafer at a first rotational speed within the processing chamber;

while the wafer chuck and the wafer are rotating, using a blade to remove an annular portion of the upper surface of the wafer to thereby define an annular ledge that is recessed relative to the upper surface of the wafer along the circumferential edge of the wafer;

as the wafer chuck and the wafer are rotating and the blade is removing the annular portion of the upper surface of the wafer, measuring a lattice stress condition in an area of the wafer adjacent to the blade; and reducing the first rotational speed of the wafer chuck and wafer to a second rotational speed when the lattice stress condition measured in the area of the of the wafer adjacent to the blade is greater than a predetermined stress threshold.

15. The method of claim 14, wherein the measuring of the lattice stress condition is performed using confocal laser scanning microscopy.

16. The method of claim 15, wherein the predetermined stress threshold is a Raman peak intensity value measured by the confocal laser scanning microscopy.

17. The method of claim 14, further comprising cleaning the wafer after the removal the annular portion of the upper surface of the wafer.

18. The method of claim 14, wherein the blade has a third rotational speed to remove the annular portion of the upper surface of the wafer.

19. The method of claim 18, further comprising:
reducing the third rotational speed of the blade to a fourth rotational speed when the lattice stress condition measured in the area of the of the wafer adjacent to the blade is greater than the predetermined stress threshold.

20. The method of claim 18, wherein the blade comprises a spindle having an axis about which the blade rotates, and wherein the axis of the spindle is fixed with regards to a location on a sidewall of the processing chamber.

* * * * *